(12) United States Patent
Chang et al.

(10) Patent No.: US 6,566,224 B1
(45) Date of Patent: May 20, 2003

(54) PROCESS FOR DEVICE FABRICATION

(75) Inventors: Chorng-Ping Chang, Berkeley Heights, NJ (US); Chien-Shing Pai, Bridgewater, NJ (US)

(73) Assignee: Agere Systems, Inc., Allentown, PA (US)

( * ) Notice: Subject to any disclaimer, the term of this patent is extended or adjusted under 35 U.S.C. 154(b) by 0 days.

(21) Appl. No.: 08/903,974

(22) Filed: Jul. 31, 1997

(51) Int. Cl.[7] ............................................... H01L 21/76
(52) U.S. Cl. ...................................................... 438/424
(58) Field of Search ................................ 438/424, 427, 438/435, 425; 168/DIG. 50

(56) References Cited

U.S. PATENT DOCUMENTS

| | | | |
|---|---|---|---|
| 5,387,540 A | 2/1995 | Poon et al. .................... | 437/67 |
| 5,433,794 A | 7/1995 | Fazan et al. ................ | 148/33.3 |
| 5,468,676 A | 11/1995 | Madan ......................... | 437/70 |
| 5,521,422 A | 5/1996 | Mandelman et al. ....... | 257/510 |
| 5,679,599 A | * 10/1997 | Mehta | |
| 5,811,346 A | * 9/1998 | Sur et al. ............. | 148/DIG. 50 |

OTHER PUBLICATIONS

F. Nouri, et al. "A fully–integrated Shallow Trench Isolation process for 0.18 μm and beyong—optimization, stress reduction and electrical performance", *VLSI Technology*.
"Corner–Rounded Shallow Trench Isolation Technology to Reduce the Stress–Induced Tunnel Oxide Leakage Current for Highly Reliable Flash Memories", by Watanabe, H. et al., *IEEE*, pp. 32.4.1–32.4.4 (1996).
A Novel 0.25μm Shallow Trench Isolation Technology, by Chen, C. et al., *IEEE*, pp. 32.5.1–32.5.4 (1996).
"Impact of Shallow Trench Isolation on Reliability of Buried–and Surface–Channel sub–μm PFET", by Tonti, W. et al., *IEEE*, 1995 IEEE International Reliability Physics Proceedings, 33rd Annual, Las Vegas, Nevada (Apr. 4–6, 1995).
"A Shallow Trench Isolation Study for 0.25/1.18 μm CMOS Technologies and Beyond", by Chatterjee, A. et al., *IEEE Electron Devices Societyfl*, 1996 Symposium on VLSI Technology, pp. 156–157, Honolulu (1996).
"A Shallow Trench Isolation Using LOCOS Edge for Preventing Corner Effects for 0.25/0.18 μm CMOS Technologies and Beyond", by Chatterjee, A. et al., *IEEE*, IEDM, pp. 32.3.1–32.3.4 (1996).
"A Three–Dimensional MOSFET Gate–Induced Drain Leakage Effect in Narrow Deep Submicron Devices", by Geissler, S. et al., *IEEE*, IEDM, pp. 32.5.1–32.5.4 (1991).

* cited by examiner

*Primary Examiner*—Trung Dang
(74) *Attorney, Agent, or Firm*—Scott J. Rittman

(57) ABSTRACT

The invention is a process for device fabrication that utilizes shallow trench isolation. The process involves the steps of forming an oxidation barrier region, e.g., silicon nitride, above a silicon substrate, providing an opening in the oxidation barrier region and in any underlying regions deposited on the silicon, providing a trench in the silicon substrate at the opening, depositing a dielectric material such as silicon dioxide in the trench, typically planarizing the trench silicon dioxide, and subsequently performing an oxidation step. The oxidation step rounds the otherwise sharp corners of the silicon at the area where the trench silicon dioxide meets the pad oxide. The invention thereby reduces or eliminates sharp corners that contribute to leakage current.

36 Claims, 9 Drawing Sheets

PROCESS FOR DEVICE FABRICATION

BACKGROUND OF THE INVENTION

1. Field of the Invention

The invention relates to the fabrication of integrated circuit devices.

2. Discussion of the Related Art

The continuing desire for greater integration of circuits requires ever-shrinking size and spacing of devices on the circuits. Current methods for electrically isolating the numerous devices, such as the use of field oxides or trench oxides, are not always sufficient. One widely-used field oxide isolation technique is local oxidation of silicon (LOCOS). In LOCOS, an oxidation barrier (typically silicon nitride) is formed over the locations on the substrate where active devices are to be formed. The substrate is then oxidized to form silicon dioxide at the unmasked areas, the silicon oxide isolating active silicon regions.

LOCOS has several limitations, however. The silicon dioxide generally grows under the barrier layer (forming what is known as a bird's beak), and thereby encroaches into the active regions. The encroachment typically increases the required spacing between devices and is therefore detrimental to attainment of higher device density. And attempts to limit the bird's beak by forming a thinner oxide layer generally result in a lower isolation threshold voltage than desired. In addition, it is possible for LOCOS to add undesirable topography to the IC surface. The silicon dioxide necessarily occupies a greater volume than the silicon from which the oxide is formed, because the silicon dioxide molecules are larger than the silicon atoms. Thus, the silicon dioxide rises above the surface of the adjacent silicon active regions, forming steps. These steps create problems in the process of forming gate structures by complicating both lithography and etching steps. The steps also affect the reliability of the conductor layer. Moreover, it is possible for the height of the steps to exceed the height acceptable for sub-micron lithographic processes, such that the steps interfere with subsequent processing steps.

A more recent isolation technique, which avoids some of the problems of LOCOS, is shallow trench isolation (STI). STI involves the formation of trenches in the surface of the silicon substrate, and filling of the trenches with a silicon oxide, such as thermal or deposited silicon dioxide. STI is capable of providing relatively thick isolation oxides that extend into the substrate with little or no encroachment into the active regions, and which have an upper surface that is relatively coplanar with adjacent areas. STI thus offers improved isolation, greater packing density, and better planarity than LOCOS, all of which contribute to greater device density.

However, STI also suffers from some problems. Parasitic leakage paths are generally created due to the proximity of a semiconductor device to the sharp corners of a trench. The effect is reflected in FIG. 1, which shows a silicon substrate 10, trench isolation 12, gate oxide layer 14, and gate layer 16. A parasitic leakage path is created across the length of a transistor along a sharp trench corner, e.g., corner 20, due to an increased gate electric field near the corner 20. Processing often furthers this problem by sharpening the trench corners and/or thinning the gate dielectric near the corners. The leakage is increased where the gate layer 16 extends into the trench 12, forming what is known as gate wrap-around 18, such wrap-around 18 formed by typical wet etch steps used in device fabrication. Several solutions for these problems have been proposed. U.S. Pat. Nos. 5,521,422 and 5,433,794 disclose the use of spacers around the trench material. The spacers reduce both gate wrap-around (18) and the effect of sharp corners (20) along the top surface of the trench material. U.S. Pat. No. 5,387,540 discloses formation of a silicon dioxide layer over the trench material to increase the thickness of the gate dielectric near the top surface corners of the trench material. Thus, the inventors of these patents looked for ways to compensate for sharp corners (20), not to eliminate them.

The contribution of sharp corners at the area where the trench material meets the lower surface of the gate oxide, i.e., corner 20, to leakage current has been studied. See, e.g., Geissler et al., "A New Three-Dimensional MOSFET Gate-Induced Drain Leakage Effect in Narrow Deep Submicron Devices," IEDM Tech. Dig., 1991, p.839; Watanabe et al. "Corner-Rounded Shallow Trench Isolation Technology to Reduce the Stress-Induced Tunnel Oxide Leakage Current for Highly Reliable Flash Memories," IEDM Tech. Dig., 1996, p.833; and Chatterjee et al., "A Shallow Trench Isolation using LOCOS Edge for Preventing Corner Effects for 0.25/0.18 $\mu$m CMOS Technologies and Beyond," IEDM Tech. Dig., 1996, p.829. However, while calculations directed to the beneficial effects of rounded corners have been made in these articles, attempts, such as that of Chatterjee, to actually round the corners have been unsatisfactory.

Specifically, as reflected in FIGS. 1 the method of Chatterjee et al. involves formation, on a silicon substrate 21, of nitride barrier regions 22; formation of oxide regions 23 by LOCOS (FIG. 1b); removal of the oxide regions 23; application of silicon dioxide to form spacers 24 around the nitride barrier regions 22 (FIG. 1c); etching of the spacers 24; and then etching of the trenches 24 for STI (FIG. 1d). This complex method is not suitable for most commercial applications, for which simple, cost-effective processes are desired. A similar method involving a complex LOCOS/STI combination is taught by U.S. Pat. No. 5,468,676, which discusses the problem of trench sidewall leakage related to the effects of sharp corner 20. An earlier Chatterjee et al. article, "A Shallow Trench Isolation Study for 0.25/0.18 $\mu$m CMOS Technologies and Beyond," 1996 IEEE Symposium on VLSI Technology, Digest of Technical Papers, also presents an STI process. This earlier Chatterjee et al. article discusses a step of thermal oxidation at 900° C. before filling the etched trench with silicon dioxide. However, the authors of this earlier article did not recognize a way to overcome the problems of sharp corner 20, and disclosed a method that produced a minor amount of rounding insufficient to reduce or eliminate the corner problems. The later Chatterjee article specifically states that to avoid detrimental sharp corner effects of corner 20, both the complex LOCOS/STI combination and the 900° C. thermal oxidation must be performed (see section II of the later article).

Thus, while problems associated with a sharp silicon corner 20 have been recognized, solutions have focused on compensating for the sharp corner 20. A simple solution for the problem of the sharp silicon corner 20 is desired.

SUMMARY OF THE INVENTION

It has been found to be possible to round problematic sharp corners in STI structures in a relatively simple manner. Specifically, the corners of the silicon of the active regions, at the point where the trench oxide meets the lower surface of a stress relief or other region disposed directly on a silicon substrate, are desirably rounded by a single oxidation step.

The extent of rounding that substantially reduces problems caused by a sharp corner will vary, depending primarily on the amount of gate wrap-around. The oxidation step of the invention advantageously provides a radius of curvature of about 30 to about 80 nm. The oxidation step is advantageously performed in an environment and for a time and temperature that results in formation of a silicon dioxide layer about 50 nm to about 150 nm thick on a blank silicon wafer (hereafter referred to as an equivalent oxide layer). Advantageously, the temperature for oxidation ranges from about 950° C. to about 1100° C., the lower end of this range being more useful with wet oxidation (i.e., water vapor present), and the higher end with dry oxidation. The oxidation temperature affects the time required to attain the selected equivalent oxide layer, and the extent of rounding depends largely on the temperature, as well as the thickness of the equivalent oxide layer and the thickness of the oxidation barrier region.

As reflected in FIGS. 2A–2E, in one embodiment the process of the invention involves the steps of forming a stress relief region 32, e.g., a pad oxide, on a silicon substrate 30, forming an oxidation barrier region 34, e.g., silicon nitride, over the stress relief region 32, providing an opening in the stress relief 32 and oxidation barrier 34 regions, providing a trench 36 in the silicon substrate 30 at the opening, depositing a dielectric material 38, typically silicon dioxide, in the trench 36, optionally planarizing the dielectric trench material 38, and subsequently performing the oxidation step. (A dielectric material is an electrically insulating material, i.e., a material having a resistivity of about $10^6$ ohm-cm or greater.)

As reflected in FIGS. 2G and 2H, to prepare the substrate for device formation, the oxidation barrier and stress relief regions are typically stripped, and a gate oxide 42 is formed over the active regions of the silicon substrate 30. Upon formation of the gate oxide 42, the rounding provided by the oxidation remains. The invention thereby reduces or eliminates sharp corners that contribute to leakage current and other detrimental corner effects.

DETAILED DESCRIPTION OF THE INVENTION

General principles and standard procedures for device fabrication are found, for example, in Van Zant, "Microchip Fabrication," 3d Ed., McGraw-Hill, 1997. One embodiment of the invention is reflected in FIGS. 2A–2H. A stress relief region 32 is formed on a silicon substrate 30. The stress relief region 32 is typically silicon dioxide, and is known in the art as a pad oxide. The region 32 is typically formed as a layer by a standard technique known to one skilled in the art, e.g., thermal oxidation, and is used primarily to prevent defects that normally exist if an oxidation barrier region 34 such as silicon nitride is formed directly on the silicon substrate 30. A stress relief region is not always required. It is possible for other materials to be deposited directly on the silicon substrate 30. When formed from silicon dioxide, the stress relief region 32 is typically about 5 to about 30 nm thick.

An oxidation barrier region 34 is formed above, and typically directly on, the stress relief region 32. The oxidation barrier region 34 is typically silicon nitride, and is also typically formed as a layer by standard techniques known to one skilled in the art, e.g., chemical vapor deposition. When formed from silicon nitride, the region 34 is typically about 60 to about 250 nm thick. The oxidation barrier region 34 inhibits underlying silicon from oxidizing during subsequent treatments.

Figure 1:
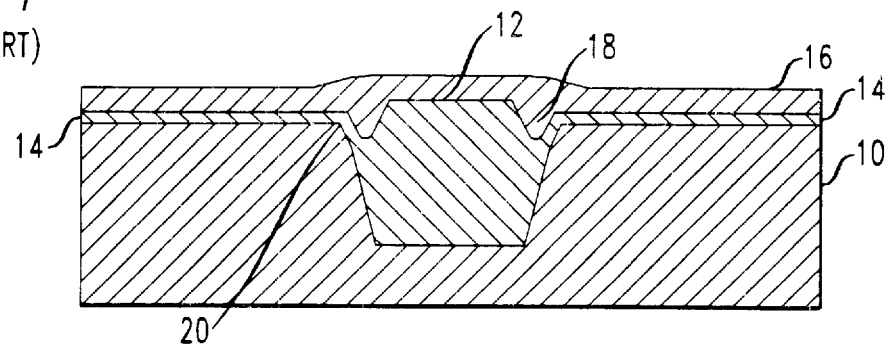
FIG. 1 reflect conventional shallow trench isolation processes.
Figure 2A:
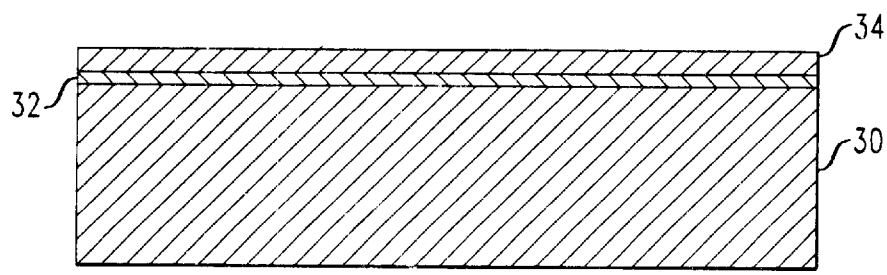
FIGS. 2A–2H show the steps in one embodiment of the invention.
Figure 2B:
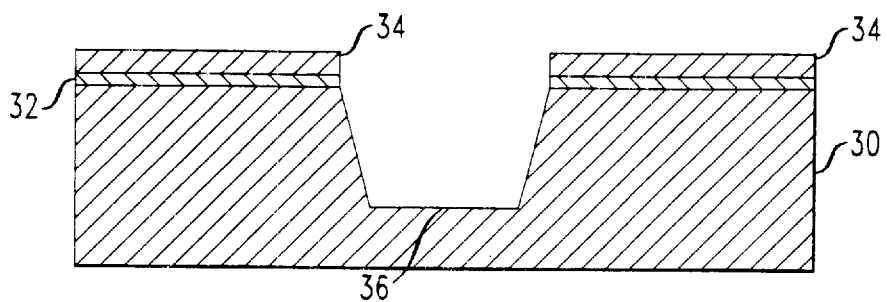

As reflected in FIG. 2B, using a standard lithographic technique, or other technique known to those skilled in the art, an opening or gap is defined on the oxidation barrier region 34, and the oxidation barrier region 34 and the stress relief region 32 are removed at the defined opening. The gap width will vary depending on the particular device, but will typically be about 0.1 to about 1000 $\mu$m wide, as measured at the top surface of the silicon substrate 30. Gaps over 1000 $\mu$m wide are also possible. It is possible to selectively form the stress relief and oxidation barrier regions 32, 34 on certain portions of the silicon substrate 30, as opposed to forming the regions 32, 34 as layers and then stripping certain areas of the layers. Once the gap is provided, a trench 36 is etched in the silicon substrate 30 using a standard technique known to those skilled in the art. Typically, the trench is about 200 to about 1000 nm deep, as measured from the top surface of the silicon substrate 30. The process of etching the trench 36 normally creates some damage, e.g., dislocations in the silicon lattice, along the trench walls, and to repair some of this damage, it is possible to oxidize the trench walls, forming what is known as a thermal liner (not shown). The thermal liner is provided, for example, by heating to a temperature of about 900 to about 1100° C., in an atmosphere of 100% oxygen (dry), for a time sufficient to achieve a liner thickness of about 20 to about 40 nm.

Figure 2C:
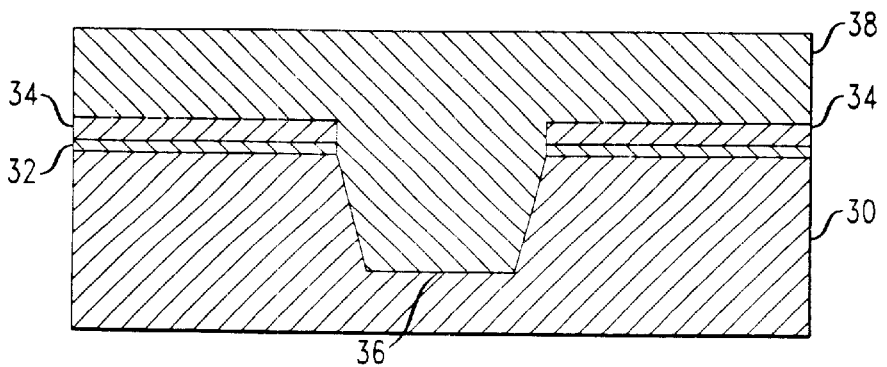
Figure 2D:
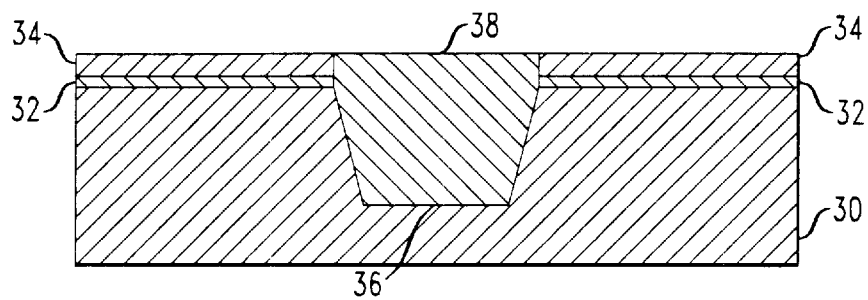

Once the trench 36 is formed (and optionally provided with a thermal liner), silicon dioxide 38 is deposited, typically such that the trench 36 is filled, as reflected in FIG. 2C. It is possible to deposit other dielectric materials in the trench 36, but the trench material advantageously contains a silicon oxide. The silicon dioxide 38 is typically provided by chemical vapor deposition (CVD), or by other standard techniques known to those skilled in the art. A planarization step, e.g., chemical-mechanical polishing or another standard technique, is typically performed when the trench 36 is filled with the silicon oxide 38, in order to provide a planar surface. The oxidation barrier region 34 typically acts as a planarization stop. The planarization, which gives the trench material a relatively flat, uniform surface, is useful in allowing relatively uniform oxidation during the subsequent oxidation step. Desirable control of the process is thereby attained. FIG. 2D shows the trench profile after such planarization.

Figure 2E:
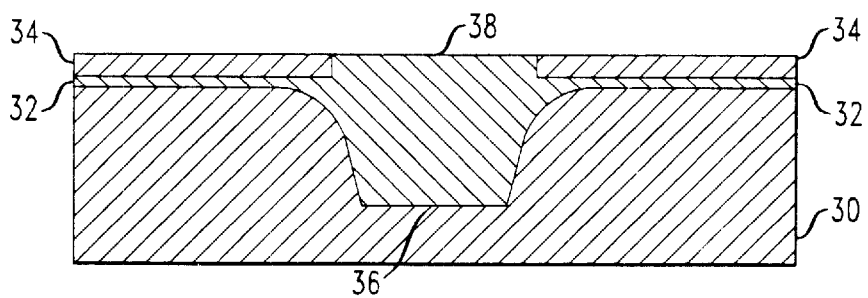

Once the trench 36 is filled and planarized, an oxidation step is performed. As shown in FIG. 2E, the oxidation is performed such that the silicon corners are rounded at the area where the trench silicon dioxide 38 meets the pad oxide 32. The oxygen diffuses through the trench silicon dioxide to reach the corners. Typically, the oxidation step will also oxidize silicon lying along the trench 36, forming a layer similar to the thermal liner discussed above. For this reason, it is possible to omit the step of forming a thermal liner after forming the trench 36. The oxidation step will also typically densify the trench silicon oxide 38. The oxidation step is advantageously performed in an environment and for a time and temperature that provides an equivalent oxide layer about 50 nm to about 150 nm thick. An advantageous temperature range for the oxidation step is from about 950° C. to about 1100° C., the lower end of this range being more useful with wet oxidation, and the higher end with dry oxidation. Wet oxidation at about 950° C. is typically faster than dry oxidation at higher temperatures, but is capable of introducing ammonia defects into the active regions of the device. An atmosphere of 99% oxygen and 1% dichloroethylene has been found to be useful for the oxidation step, and other oxygen-containing atmospheres are also contemplated.

Figure 2F:
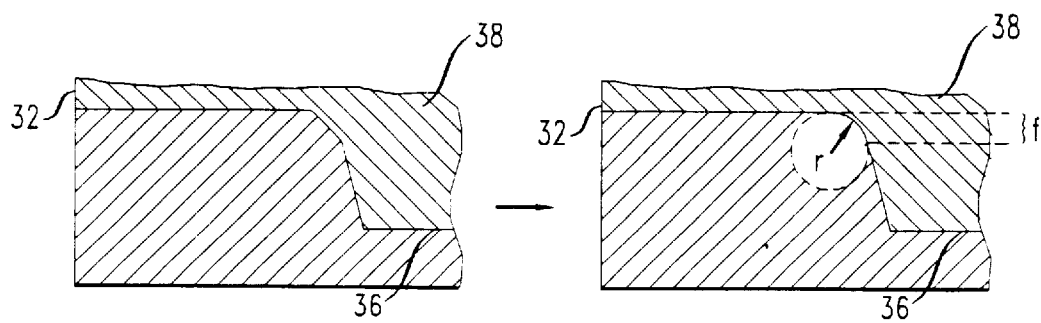

At temperatures around 950° C., the silicon corner at the area where the trench silicon oxide 38 meets the pad oxide 32 will typically begin to oxidize, forming one or more areas having flat surfaces, but higher temperatures are generally required for the edges to become round, i.e., have a radius of curvature, r. FIG. 2F shows a close-up view of the transformation of such flat areas to a rounded corner having a radius of curvature, r, and an overall facet size, f. The radius of curvature, r, is advantageously about 30 to about 80 nm, and the overall facet size, f, is advantageously about 20 to about 80 nm. The extent of faceting and rounding depends in large part on the combination of oxidation temperature, equivalent oxide layer, and the thickness of the oxidation barrier region. For example, a thicker oxidation barrier region will typically impede growth of the silicon dioxide bird's beak under the region, and a longer time and/or higher temperature, i.e., a thicker equivalent oxide layer, will be required to obtain the desired rounding. A model for determining the facet size subsequent to the oxidation step is reflected in Example 1 below. A corner is considered to be rounded when at least 30% of the portion of the corner's boundary within the overall facet, f, matches, to within a few nanometers, the perimeter of a single circle with radius, r.

Figure 2G:
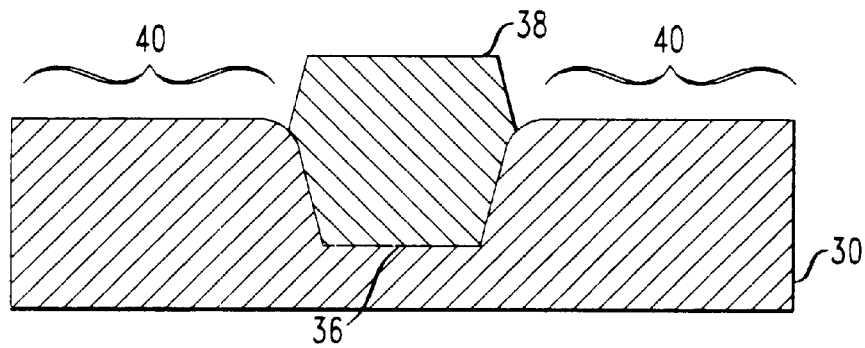
Figure 2H:
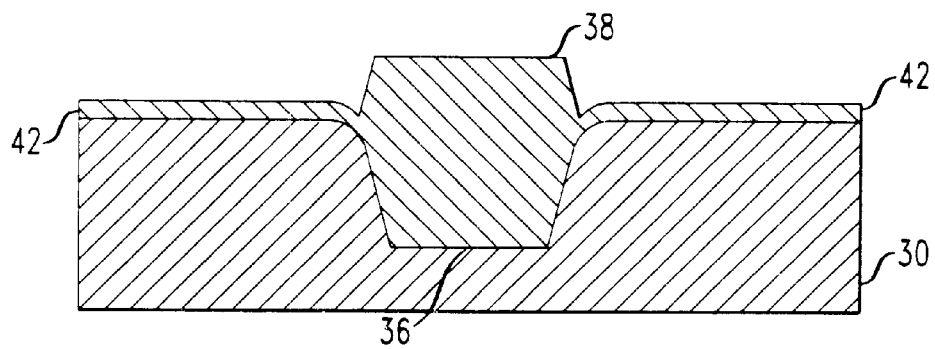
Figure 3:
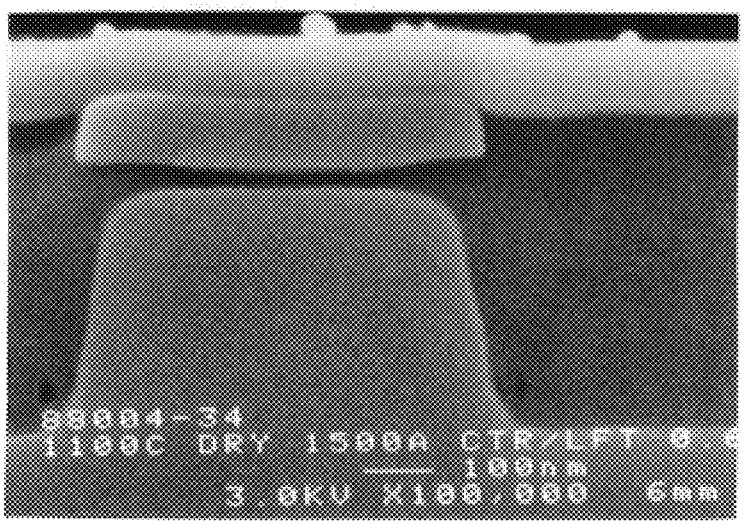
FIGS. 3–14 are scanning electron micrographs of trench structures made according to the process of the invention and of a comparison structure.
Figure 4:

After the oxidation step, the remaining portions of the oxidation barrier region 34, and the stress relief region 32 are typically stripped, providing silicon active regions 40 isolated by trench silicon dioxide 38, as reflected in FIG. 2G. In preparation for forming devices, e.g., CMOS devices, a gate oxide 42, as reflected in FIG. 2H, is typically formed over the active regions in accordance with standard practice known to one skilled in the art. The rounding provided by the oxidation step remains, reducing the sharp corners that contribute to leakage current in devices subsequently formed. The rounded corners of the trenches provide, among other things, transistors that exhibit a higher threshold voltage and lower off-current than transistors for which no oxidation step is performed, as reflected in Example 2 below.

The invention will be further clarified by the following examples, which are intended to be exemplary.

EXAMPLE 1

Figure 14:
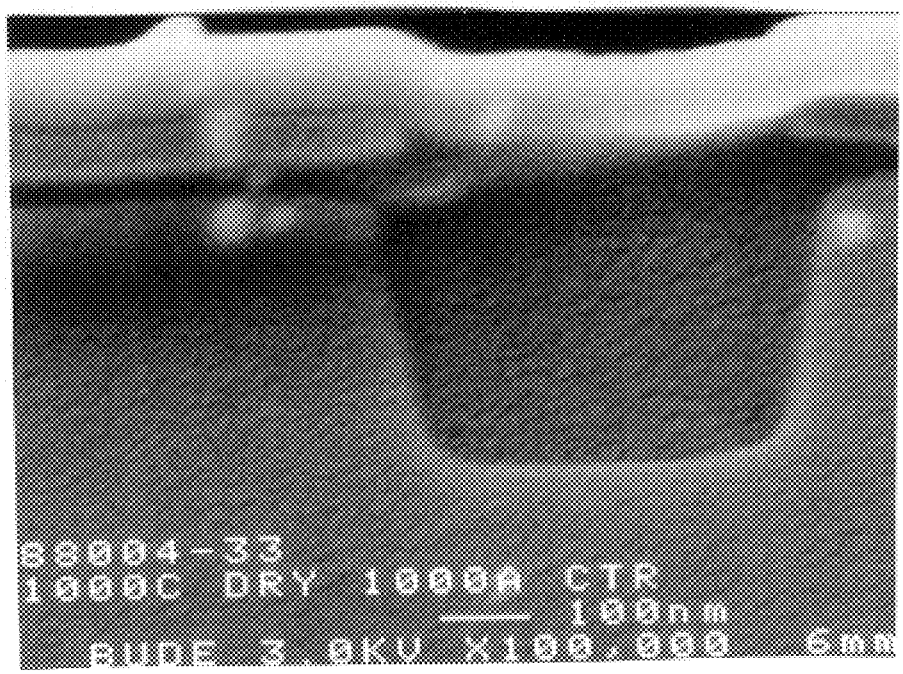

The effects that a variety of parameters had on rounding of the silicon corner at the area where the trench silicon dioxide meets the pad oxide were explored. Each sample was prepared as follows: On a silicon substrate, a silicon dioxide (pad oxide) region was formed by thermal oxidation. The pad oxide region had a thickness of 30 nm for each sample. A silicon nitride region, of the varying thicknesses shown below, was formed on the pad oxide region by chemical vapor deposition. A gap, of the widths shown in Table I, was etched into the pad oxide and silicon nitride regions by a conventional method. After the gap was etched, the trench was etched in the silicon substrate by a conventional method. The trench had a depth, measured from the top surface of the silicon substrate, of 300 nm for each sample. A thermal liner about 36 nm thick was formed by heating the article to 1000° C. for 15 minutes. The trench was then filled with silicon dioxide by high density plasma enhanced chemical vapor deposition to a height of about 600 nm above the top surface of the silicon nitride. Chemical-mechanical polishing was performed to planarize the trench silicon dioxide to the level of the top surface of the silicon nitride, which acted as a polishing stop. The oxidation step was then performed at the environments (wet or dry), temperatures, equivalent oxide layers, and times shown in Table I. Scanning electron micrographs (FIGS. 3–14) were then taken of the trench profiles (the temperature information printed on FIG. 14 is incorrect and should read 1100° C.).

TABLE I

| Figure Number | Environment | Temp. (° C.) | Equivalent Oxide (nm) | Time | Nitride Thickness (nm) | Radius of Curvature (nm)* | Gap (μm) |
| --- | --- | --- | --- | --- | --- | --- | --- |
| 3 | Dry | 1100 | 150 | 55 min | 110 | 60 | 2 |
| 4 | Dry | 1100 | 150 | 55 min | 110 | 60 | 0.5 |
| 5 (comparative) | No oxidation | No oxidation | No oxidation | No oxidation | 150 | ** | 0.5 |
| 6 | Wet | 950 | 150 | 35 min | 60 | *** | 0.5 |
| 7 | Dry | 1000 | 150 | 4 hours | 70 | 35 | 0.5 |
| 8 | Dry | 1100 | 150 | 55 min | 80 | 70 | 0.5 |
| 9 | Dry | 1100 | 150 | 55 min | 50 | 80 | 0.5 |
| 10 | Dry | 1100 | 150 | 55 min | 90 | 60 | 0.5 |
| 11 | Dry | 1100 | 150 | 55 min | 130 | 40 | 0.5 |
| 12 | Dry | 1100 | 150 | 55 min | 190 | 35 | 0.5 |
| 13 | Dry | 1100 | 50 | 5 min | 65 | 30 | 0.5 |
| 14 | Dry | 1100 | 100 | 25 min | 60 | 50 | 0.5 |

Figure 5:
Figure 6:
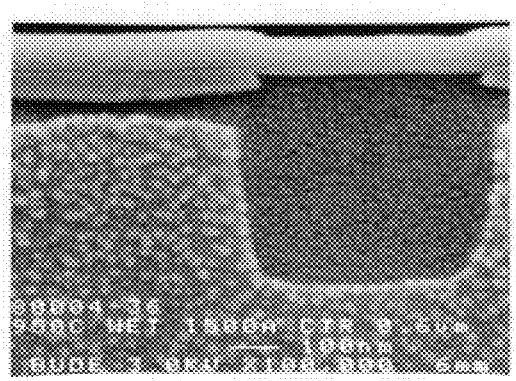
Figure 7:
Figure 8:
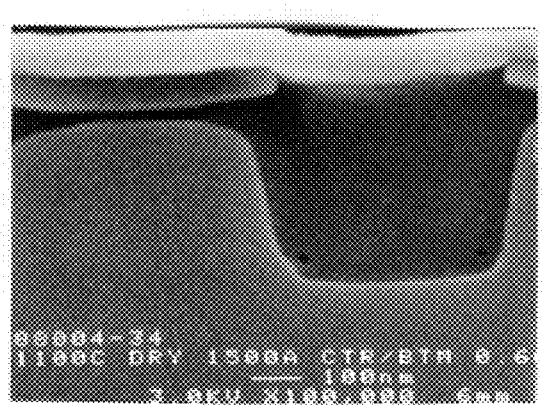
Figure 9:
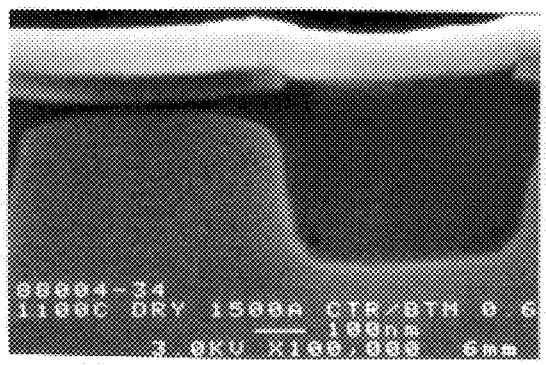
Figure 10:
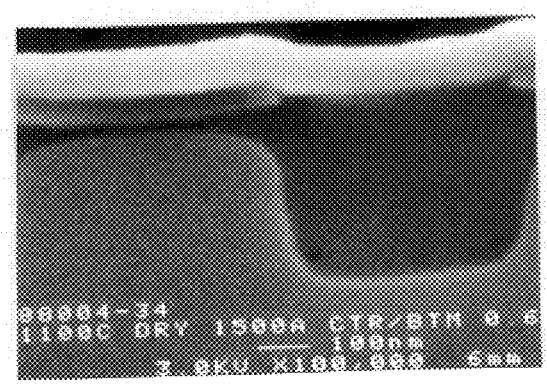
Figure 11:
Figure 12:
Figure 13:
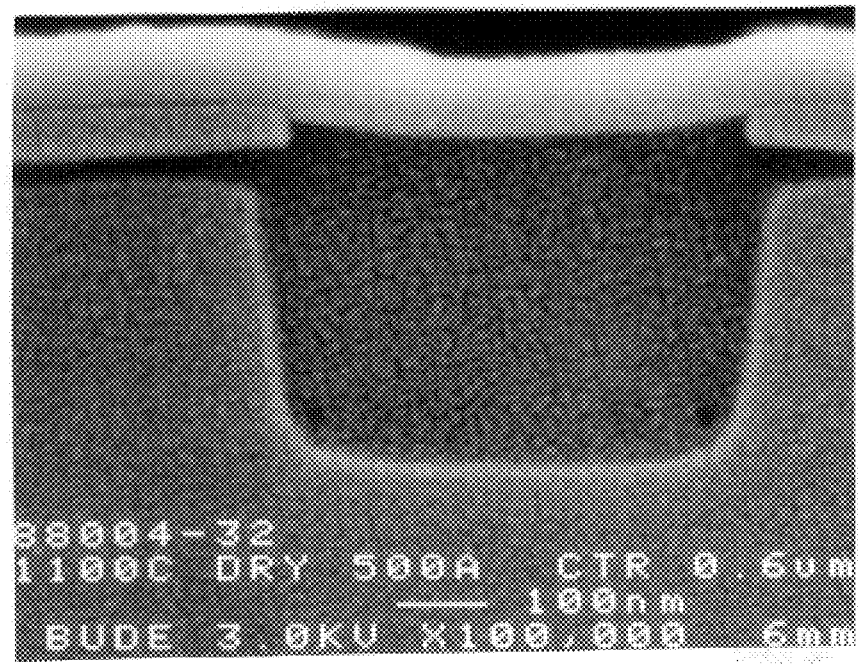

*The values have an error of approximately ± 5 nm
**No rounding
***Only faceting observed FIGS. 3, 4, and 6–14 show various degrees of rounding provided by the invention. In addition, FIG. 5 shows the trench profile of a comparative example where the oxidation step was omitted. It is clear from FIG. 5 that the step of forming a thermal liner has a very minor effect on the silicon corner where the trench silicon oxide meets the pad oxide. In particular, it was found that formation of a thermal liner typically resulted in an initial facet of about 10 nm.

From the samples analyzed, a model was developed for the facet size (f of FIG. 2F) that develops from the oxidation step. The facet is proportional to $d_{barrier}$, the thickness of the oxidation barrier region, and $d_{oxid}$, which is a function of (1) the distance, d, that oxygen must diffuse from the surface of the trench oxide to the corner to be rounded and (2) the thermal budget (e.g., time and temperature) of the process. For a given d and thermal treatment, it is possible to determine $d_{oxid}$ from the known effect of the particular thermal treatment on a silicon dioxide layer of thickness d overlying a silicon substrate. Specifically, where a silicon dioxide layer initially has a certain thickness, a certain thermal treatment will produce a particular thickness increase. (Such relationships between silicon dioxide growth and thermal treatment are available, for example in *VLSI Technology*, S. Sze, Editor, McGraw-Hill, 1983.) For purposes of the model, the sum of the thicknesses of the oxidation barrier region and stress relief region is used for the initial silicon dioxide thickness, d, and the larger thickness resulting from the particular thermal treatment is plugged into the model as $d_{oxid}$.

Using these variables, it was found that the facet size, F, caused by the oxidation step could be expressed as:

$$F(=\text{total faceting } (f) - \text{initial 10 nm facet}) \, (d_{oxid})^a (d_{barrier})^{-b}$$

Figure 15:
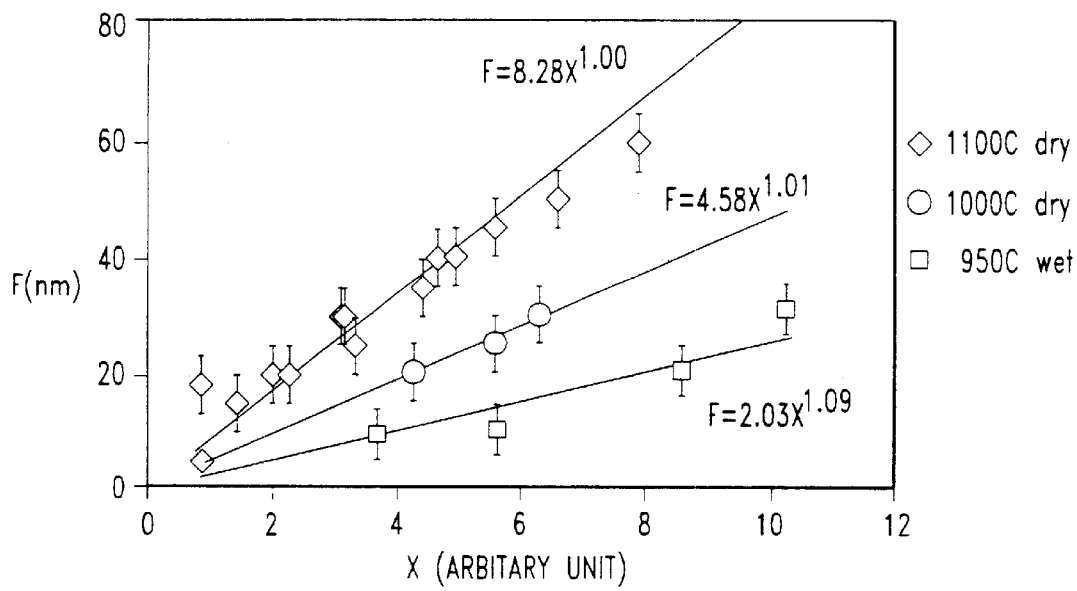
FIG. 15 reflects a model for determining the facet size resulting from the oxidation step.

(The initial facet size of 10 nm results from thermal liner oxidation.) For a silicon dioxide stress relief region of 30 nm and a trench spacing of 400 nm, the best fit found for the above samples (at a given temperature) is reflected in FIG. 15 as a function of a variable X, where:

$$X = (d_{oxid})^{0.75} (d_{barrier})^{-0.35}.$$

In particular, for dry oxidation at 1100 and 1000° C., the model is $F=8.28X^{1.00}$ and $F=4.58X^{1.01}$, respectively. For wet oxidation at 950° C., the model is $F=2.03X^{1.09}$.

Example 2

The electrical properties of transistors fabricated with and without the oxidation step of the invention were compared.

Transistors were fabricated by conventional CMOS fabrication processes known to one skilled in the art. For both transistors made with and without the oxidation step of the invention, the following process steps were performed. On a silicon substrate, a silicon dioxide (pad oxide) region was formed by thermal oxidation. The pad oxide region had a thickness of 30 nm. A silicon nitride region having a thickness of about 117 nm was formed on the pad oxide region by chemical vapor deposition. A gap of about 10 μm or greater was etched into the pad oxide and silicon nitride regions by a conventional method. After the gap was etched, the trench was etched in the silicon substrate by a conventional method. The trench had a depth, measured from the top surface of the silicon substrate, of 300 nm. A thermal liner about 36 nm thick was formed by heating the article to 1000° C. for 15 minutes. The trench was then filled with silicon dioxide by high density plasma enhanced chemical vapor deposition to a height of about 600 nm above the top surface of the silicon nitride. Chemical-mechanical polishing was performed to planarize the trench silicon dioxide to the level of the top surface of the silicon nitride, which acted as a polishing stop. Where corner-rounding oxidation was desired, the oxidation step was performed at a temperature of 1100° C. for a time sufficient to form a 150 nm equivalent oxide.

Figure 16:
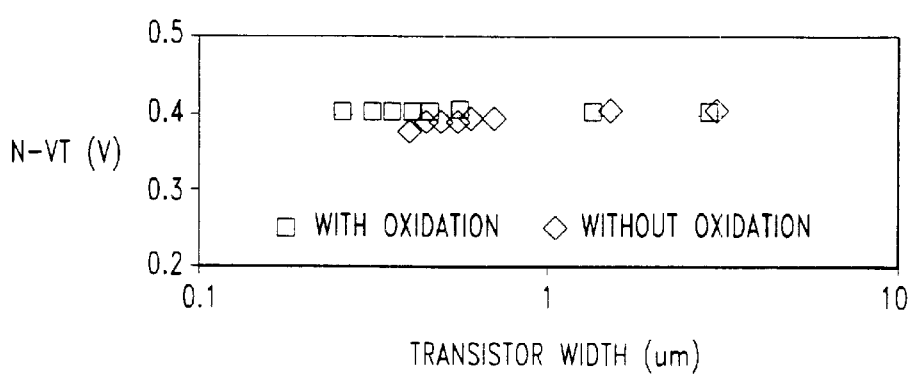
FIG. 16 shows the relationship between transistor width and threshold voltage for transistors made with and without the oxidation step of the invention.

FIG. 16 is a plot of transistor width versus the n-junction threshold voltage ($N-V_t$) for transistors having a length of 5 μm. Transistors fabricated with the corner-rounding oxidation step of the invention exhibited no reverse narrow channel effect (also known in the art as narrow width effect, as discussed in Chatterjee et al., "A Shallow Trench Isolation using LOCOS Edge for Preventing Corner Effects for 0.25/0.18 μm CMOS Technologies and Beyond," discussed above), even at small channel widths. Transistors made without the oxidation step clearly showed some reverse narrow channel effect at smaller widths (e.g., less than 1 μm). Thus, the corner rounding that takes place during the oxidation step eliminated corner effects that lead to the reverse narrow channel effect in small-width transistors.

Figure 17:
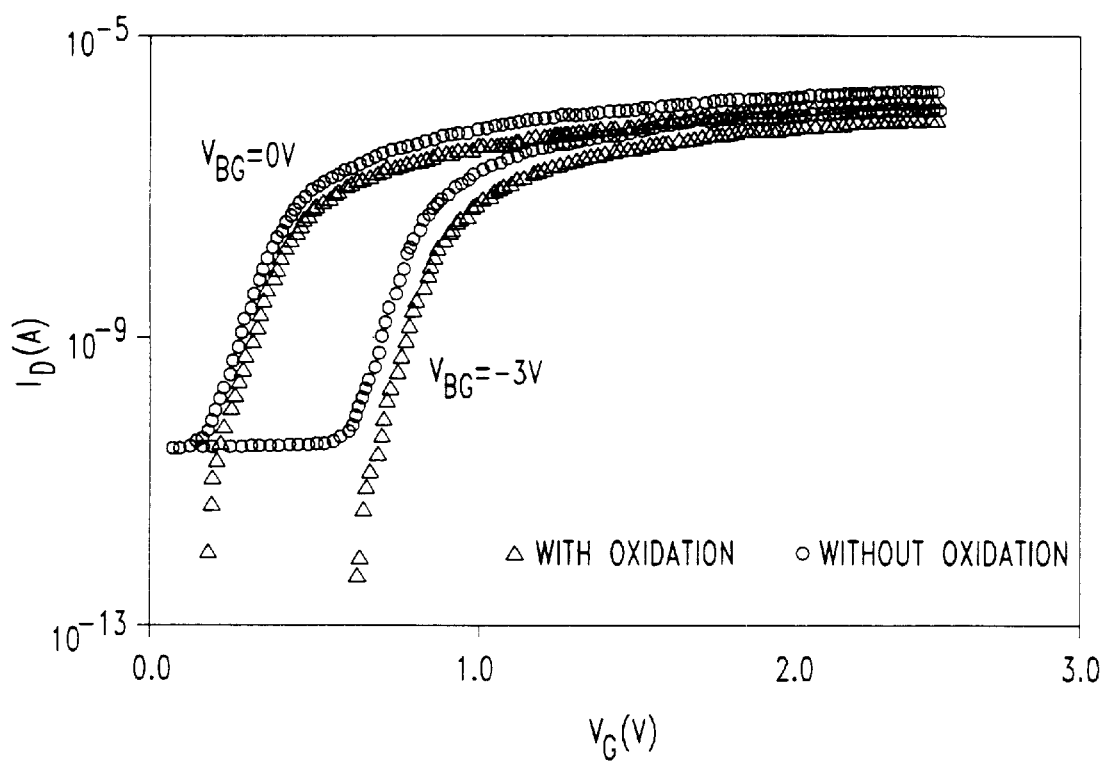
FIG. 17 shows the relationship between gate voltage and drain current for transistors made with and without the oxidation step of the invention.

This result is further illustrated in FIG. 17. The transistors had a length of 5 μm and a width of 0.4 μm. As reflected in FIG. 15, the transistors for which the oxidation step was performed desirably exhibited a higher threshold voltage and lower off-current. ($V_G$ is gate voltage; $I_D$ is drain current; $V_{BG}$ is back gate voltage.)

Other embodiments of the invention will be apparent to those skilled in the art from consideration of the specification and practice of the invention disclosed herein.

What is claimed is:

1. A process for device fabrication, comprising the steps of:
   forming an oxidation barrier region above a silicon substrate;
   providing an opening in the oxidation barrier region and in any underlying regions deposited on the silicon substrate;
   providing a trench in the silicon substrate at the opening;
   depositing a dielectric material in the trench; and
   performing an oxidation subsequent to the deposition step, wherein the oxidation rounds corners of the silicon substrate at an area where the trench dielectric material meets the region deposited directly on the silicon substrate, and wherein after the oxidation the corners have a radius of curvature of about 30 to about 80 nm.

2. The process of claim 1, further comprising a step of planarizing the trench dielectric material prior to performing the oxidation.

3. The process of claim 1, further comprising a step of forming a stress relief region directly on the silicon substrate.

4. The process of claim 1, wherein the dielectric material is silicon dioxide.

5. The process of claim 3, wherein the stress relief region is silicon dioxide.

6. The process of claim 1, wherein the oxidation barrier region is silicon nitride.

7. The process of claim 1, wherein the oxidation step is performed at a temperature of about 950° C. to about 1100° C.

8. The process of claim 1, wherein the oxidation step is performed for a time and temperature sufficient to obtain about 50 to about 150 nm of an equivalent oxide layer.

9. The process of claim 1, further comprising a step of oxidizing walls of the trench prior to filling the trench.

10. A process for device fabrication, comprising the steps of:
- forming an oxidation barrier region above a silicon substrate;
- providing an opening in the oxidation barrier region and in any underlying regions deposited on the silicon substrate;
- providing a trench in the silicon substrate at the opening;
- depositing a dielectric material in the trench; and
- performing an oxidation subsequent to the deposition step, wherein the oxidation rounds corners of the silicon substrate at an area where the trench dielectric material meets the region deposited directly on the silicon substrate, and wherein after the oxidation the corners have a facet of about 20 to about 80 nm.

11. The process of claim 10, further comprising a step of planarizing the trench dielectric material prior to performing the oxidation.

12. The process of claim 10, further comprising a step of forming a stress relief region directly on the silicon substrate.

13. The process of claim 10, wherein the dielectric material is silicon dioxide.

14. The process of claim 12, wherein the stress relief region is silicon dioxide.

15. The process of claim 10, wherein the oxidation barrier region is silicon nitride.

16. The process of claim 10, wherein the oxidation step is performed at a temperature of about 950° C. to about 1100° C.

17. The process of claim 10, wherein the oxidation step is performed for a time and temperature sufficient to obtain about 50 to about 150 nm of an equivalent oxide layer.

18. The process of claim 10, further comprising a step of oxidizing walls of the trench prior to filling the trench.

19. A process for device fabrication, comprising the steps of:
- forming an oxidation barrier region above a silicon substrate;
- providing an opening in the oxidation barrier region and in any underlying regions deposited on the silicon substrate;
- providing a trench in the silicon substrate at the opening, the trench having a depth of about 200 to about 1000 nm;
- depositing a dielectric material in the trench; and
- performing an oxidation subsequent to the deposition step, wherein the oxidation rounds corners of the silicon substrate at an area where the trench dielectric material meets the region deposited directly on the silicon substrate.

20. The process of claim 19, further comprising a step of planarizing the trench dielectric material prior to performing the oxidation.

21. The process of claim 19, further comprising a step of forming a stress relief region directly on the silicon substrate.

22. The process of claim 19, wherein the dielectric material is silicon dioxide.

23. The process of claim 21, wherein the stress relief region is silicon dioxide.

24. The process of claim 19, wherein the oxidation barrier region is silicon nitride.

25. The process of claim 19, wherein the oxidation step is performed at a temperature of about 950° C. to about 1100° C.

26. The process of claim 19, wherein the oxidation step is performed for a time and temperature sufficient to obtain about 50 to about 150 nm of an equivalent oxide layer.

27. The process of claim 19, further comprising a step of oxidizing walls of the trench prior to filling the trench.

28. A process for device fabrication, comprising the steps of:
- forming an oxidation barrier region above a silicon substrate;
- providing an opening in the oxidation barrier region and in any underlying regions deposited on the silicon substrate, the opening having a width of about 0.1 to about 1000 μm;
- providing a trench in the silicon substrate at the opening;
- depositing a dielectric material in the trench; and
- performing an oxidation subsequent to the deposition step, wherein the oxidation rounds corners of the silicon substrate at an area where the trench dielectric material meets the region deposited directly on the silicon substrate.

29. The process of claim 28, further comprising a step of planarizing the trench dielectric material prior to performing the oxidation.

30. The process of claim 28, further comprising a step of forming a stress relief region directly on the silicon substrate.

31. The process of claim 28, wherein the dielectric material is silicon dioxide.

32. The process of claim 30, wherein the stress relief region is silicon dioxide.

33. The process of claim 28, wherein the oxidation barrier region is silicon nitride.

34. The process of claim 28, wherein the oxidation step is performed at a temperature of about 950° C. to about 1100° C.

35. The process of claim 28, wherein the oxidation step is performed for a time and temperature sufficient to obtain about 50 to about 150 nm of an equivalent oxide layer.

36. The process of claim 1, further comprising a step of oxidizing walls of the trench prior to filling the trench.

* * * * *